(12) United States Patent
Kim et al.

(10) Patent No.: US 9,949,397 B2
(45) Date of Patent: Apr. 17, 2018

(54) TOUCH PANEL HAVING IMPROVED VISIBILITY AND METHOD OF MANUFACTURING THE SAME

(71) Applicant: Samsung Electronics Co. Ltd., Suwon-si, Gyeonggi-do (KR)

(72) Inventors: Myung-Gon Kim, Hwaseong-si (KR); Jong-Woo Kim, Suwon-si (KR); Hyon-Myong Song, Suwon-si (KR); Duck-Yong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 889 days.

(21) Appl. No.: 13/763,115

(22) Filed: Feb. 8, 2013

(65) Prior Publication Data

US 2013/0223016 A1 Aug. 29, 2013

(30) Foreign Application Priority Data

Feb. 23, 2012 (KR) ........................ 10-2012-0018264
Aug. 20, 2012 (KR) ........................ 10-2012-0090487

(51) Int. Cl.
*F21V 9/06* (2006.01)
*G02B 5/20* (2006.01)
*B32B 1/04* (2006.01)
*B32B 3/02* (2006.01)
*H05K 7/06* (2006.01)
*G06F 3/044* (2006.01)

(52) U.S. Cl.
CPC ............... *H05K 7/06* (2013.01); *G06F 3/044* (2013.01); *Y10T 156/10* (2015.01)

(58) Field of Classification Search
CPC . G06F 2203/04103; G06F 2203/04112; G06F 3/03547; G06F 3/0488; G06F 1/13338; G06F 3/041; G06F 3/045; G06F 3/044; B05D 5/12; B32B 7/02; B32B 5/16; B32B 7/12; G09F 3/10; H05K 1/09; Y10T 156/10
USPC ....... 359/350–361, 609, 298, 577, 580, 581, 359/586, 588, 589, 590, 601, 613, 614; 345/173, 158, 165; 361/728; 156/60; 428/68, 141, 212, 217, 327, 336, 339, 428/447, 482, 500, 690, 702
See application file for complete search history.

(56) References Cited

U.S. PATENT DOCUMENTS

| 6,743,488 B2 | 6/2004 | Memarian et al. |
| 2006/0240232 A1* | 10/2006 | Faris ............... G02B 1/111 428/212 |
| 2008/0026215 A1 | 1/2008 | Wan et al. |

(Continued)

FOREIGN PATENT DOCUMENTS

| EP | 2 169 520 A2 | 3/2010 |
| EP | 2 306 278 A1 | 4/2011 |

(Continued)

*Primary Examiner* — Mustak Choudhury
(74) *Attorney, Agent, or Firm* — Jefferson IP Law, LLP

(57) ABSTRACT

A touch panel having improved visibility is provided. The touch panel includes a window part, at least one ultraviolet (UV) resin layer attached to a bottom surface of the window part, and a display part including a touch sensor film module attached to a bottom surface of the at least one UV resin layer such that the UV resin layer prevents refractions and reflections of light.

28 Claims, 6 Drawing Sheets

(56) References Cited

U.S. PATENT DOCUMENTS

| | | | |
|---|---|---|---|
| 2008/0220198 A1* | 9/2008 | Tsukahara | H01L 51/5237 428/68 |
| 2009/0002323 A1 | 1/2009 | Shiroishi et al. | |
| 2009/0029151 A1* | 1/2009 | Noguchi | B32B 27/00 428/327 |
| 2009/0315849 A1 | 12/2009 | Ito | |
| 2011/0012839 A1* | 1/2011 | Lin | 345/173 |
| 2011/0033720 A1 | 2/2011 | Fujita et al. | |
| 2011/0109590 A1* | 5/2011 | Park | G06F 3/0412 345/174 |
| 2011/0279387 A1 | 11/2011 | Kim et al. | |
| 2012/0039057 A1 | 2/2012 | Paleczny et al. | |
| 2012/0223905 A1 | 9/2012 | Jeon et al. | |
| 2012/0314350 A1* | 12/2012 | Choi | H04M 1/0202 361/679.01 |

FOREIGN PATENT DOCUMENTS

| | | |
|---|---|---|
| JP | 2010-257208 A | 11/2010 |
| KR | 10-2011-0002857 A | 1/2011 |
| WO | 2008/014156 A1 | 1/2008 |
| WO | 2011/159028 A2 | 12/2011 |
| WO | 2011/159028 A3 | 12/2011 |

\* cited by examiner

TOUCH PANEL HAVING IMPROVED VISIBILITY AND METHOD OF MANUFACTURING THE SAME

PRIORITY

This application claims the benefit under 35 U.S.C. § 119(a) of a Korean patent application filed on Feb. 23, 2012 in the Korean Intellectual Property Office and assigned Serial No. 10-2012-0018264, and a Korean patent application filed on Aug. 20, 2012 in the Korean Intellectual Property Office and assigned Serial No. 10-2012-0090487, the entire disclosure of each of which is hereby incorporated by reference.

BACKGROUND OF THE INVENTION

1. Field of the Invention

The present invention relates to a touch panel. More particularly, the present invention relates to a touch panel having improved visibility, and a method of manufacturing the same.

2. Description of the Related Art

In general, the visibility of portable communication devices has improved due to remarkable developments in multimedia and display technologies. Accordingly, touch panels are increasingly employed in portable communication devices.

In the case of a general resistive touch sensor, since the touch panel can provide location information only when two sensors contact each other as a result of touch pressure, a film needs to be attached to a window provided in a portable communication device. In contrast, a capacitive touch panel provides the location of a point where electric charges are discharged during a touch.

A capacitive touch panel will be described in more detail as follows.

FIG. 1 is a view illustrating a configuration of a touch panel including a window according to the related art Referring to FIG. 1, the capacitive touch panel 1 includes a window part 2 formed of reinforced glass, a polymer film layer 3 attached to a bottom surface of the window part 2, a pattern ultraviolet (UV) resin layer 4 applied to an lower portion of the polymer film layer 3, a touch sensor film module 5 attached to a bottom surface of the pattern UV resin layer 4, and a display part, e.g., a Liquid Crystal Display (LCD) 6 attached to a bottom surface of the touch sensor film module 5.

The pattern UV resin layer 4 is applied to the polymer film layer 3 to form a pattern 7. The pattern 7 is formed in the applied pattern UV resin layer 4, and the pattern 7 is deposited 8 and printed 9. Bubbles 12 may be generated during deposition or printing. The polymer film layer 3 is attached to the window part 2 by using, e.g., an Optically Clear Adhesive (OCA) (not illustrated).

In FIG. 1, the touch sensor film module 4 is attached to a bracket 6a of the display part (e.g., LCD) 6 through a double-sided tape 10. Then, an air layer 11 is provided between the touch sensor film module 4 and the display part (e.g., LCD) 6 to protect the display part (e.g., LCD) 6 from deflection of the window part 2.

The configuration of the touch panel is disclosed in Korean patent application Laid-Open No. 10-2011-002857 (issued on Jan. 10, 2011).

However, when light passes through different media, refractions and reflections generally occur in the touch panel due to differences in the refractivity of the different media.

Thus, in the capacitive touch panel according to the related art, light sequentially passes through the media including the window part, the UV resin layer, the touch sensor film module, the air layer, and the display part (e.g., LCD), and thus refractions and reflections of light occur whenever the media are changed, lowering the visibility of the product.

In addition to the above problems in the related art, if an existing touch panel is dropped, the UV resin layer is apt to be cracked by a hard primer layer provided in the polymer film layer due to the impact. Also, in the related art, an impact to a side of the touch panel may transfer to the touch panel.

Therefore, a need exists for a method and apparatus for adding another UV resin layer for minimizing refractions and reflections of light to the existing resin layer. Additionally, a need exists for a soft primer layer to prevent the UV resin layer from being cracked due to the impact of, e.g., the touch panel being dropped. A further need also exists for a space to be provided in order to avoid damage from an impact to a side surface of the touch panel.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a touch panel having improved visibility, that is, in which a transmittance of a product is increased and a visibility of a product is enhanced, by additionally configuring a second ultraviolet (UV) resin layer for preventing refractions and reflections of light in a first UV resin layer, and a method of manufacturing the same.

In accordance with an aspect of the present invention, a touch panel having improved visibility is provided. The touch panel includes a window part, at least one ultraviolet (UV) resin layer attached to a bottom surface of the window part, and a display part including a touch sensor film module attached to a bottom surface of the at least one UV resin layer, wherein the UV resin layer prevents refractions and reflections of light.

In accordance with another aspect of the present invention, a touch panel having improved visibility is provided. The touch panel includes a window part including a polymer film layer, a first UV resin layer attached to a bottom surface of the polymer film layer, a second UV resin layer attached to a bottom surface of the first UV resin layer to prevent refractions and reflections of light, and a touch sensor film module attached to a bottom surface of the second UV resin layer.

In accordance with another aspect of the present invention, a method of manufacturing a touch panel having improved visibility is provided. The method includes manufacturing a window part, attaching a polymer film layer to a bottom surface of the window part, attaching a first UV resin layer to a bottom surface of the polymer film layer, attaching a second UV resin layer for preventing refractions and reflections of light to a bottom surface of the first UV resin layer, and attaching a display part including a touch sensor film module to a bottom surface of the second UV resin layer.

In accordance with another aspect of the present invention, a touch panel having improved visibility is provided. The touch panel includes a window part including a polymer film layer, a first UV resin layer attached to a bottom surface of the polymer film layer, a second UV resin layer attached to a bottom surface of the first UV resin layer to prevent refractions and reflections of light, and a display part including a touch sensor film module attached to a bottom surface of the second UV resin layer, wherein the polymer film layer includes a bonding layer, a film body layer formed on a bottom surface of the bonding layer, and a soft primer layer formed on a bottom surface of the film body layer.

In accordance with another aspect of the present invention, a touch panel having improved visibility is provided. The touch panel includes a window part including a polymer film layer, a first UV resin layer attached to a bottom surface of the polymer film layer, a second UV resin layer attached to a bottom surface of the first UV resin layer to prevent refractions and reflections of light, and a display part including a touch sensor film module attached to a bottom surface of the second UV resin layer, wherein the polymer film layer and the first UV resin layer are formed to be smaller than the window part and a bracket formed in the display part.

In accordance with another aspect of the present invention, a method of manufacturing a touch panel having improved visibility is provided. The method includes manufacturing a window part, attaching a polymer film layer to a bottom surface of the window part, attaching a first UV resin layer through a soft primer layer formed in the polymer film layer, attaching a second UV resin layer for preventing refractions and reflections of light to a bottom surface of the first UV resin layer, and attaching a display part including a touch sensor film module to a bottom surface of the second UV resin layer.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

First Exemplary Embodiment

Figure 3:
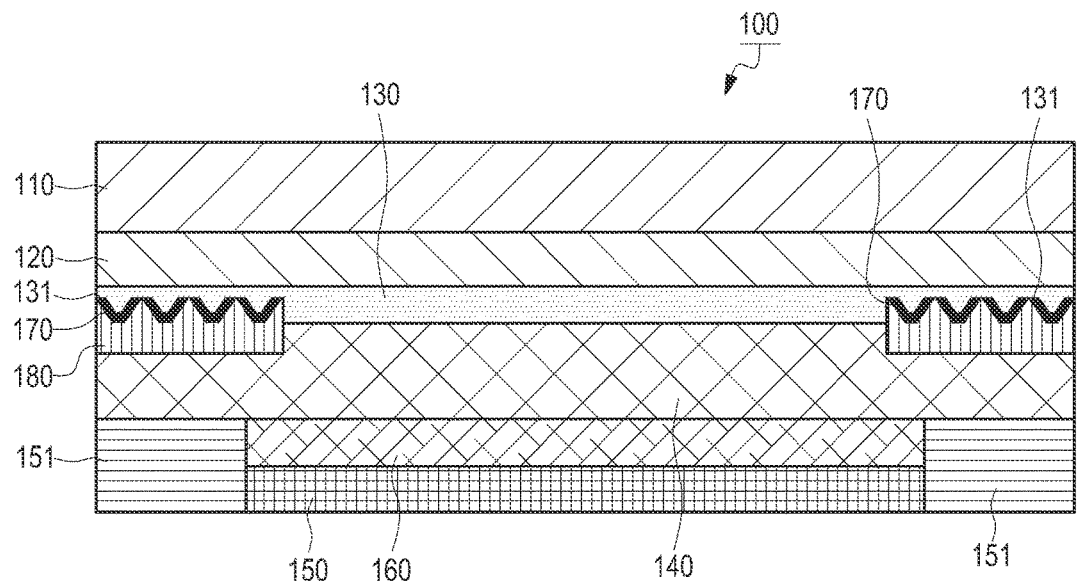
FIG. 3 is a view illustrating a coupled state of the touch panel having improved visibility according to the first exemplary embodiment of the present invention.
Figure 4:
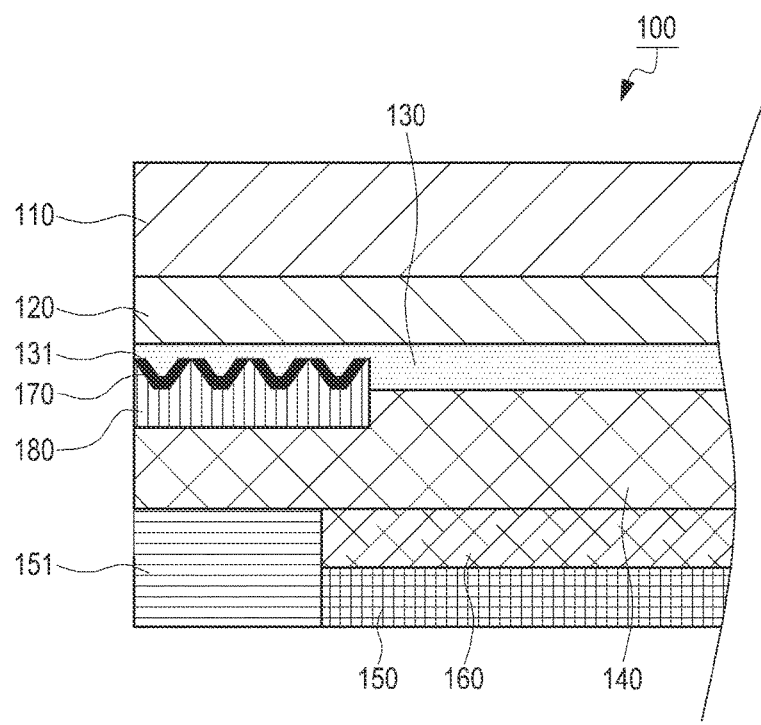
FIG. 4 is an enlarged view illustrating the touch panel having improved visibility according to the first exemplary embodiment of the present invention.

FIG. 3 is a view illustrating a coupled state of the touch panel having improved visibility according to the first exemplary embodiment of the present invention. FIG. 4 is an enlarged view illustrating the touch panel having improved visibility according to the first exemplary embodiment of the present invention.

Figure 2:
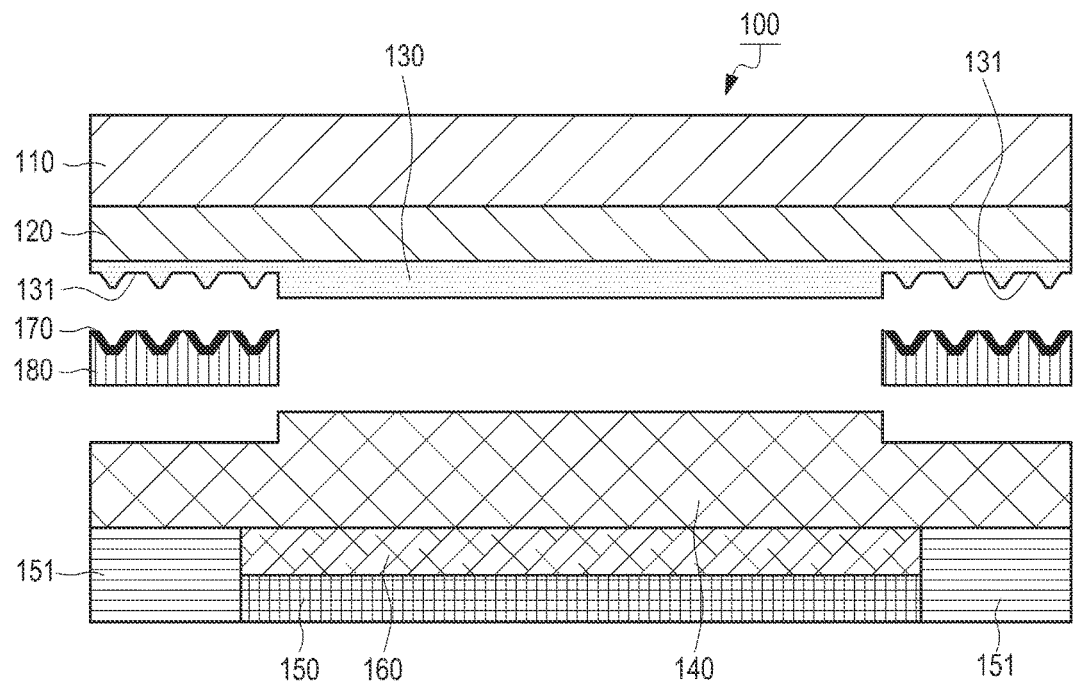
FIG. 2 is an exploded view illustrating a touch panel having improved visibility according to a first exemplary embodiment of the present invention.

Referring to FIGS. 2 and 3, the touch panel 100 includes a window part 110 including a polymer film layer 120, and a display part 150 including first and second ultraviolet (UV) resin layers 130 and 140 and a touch sensor film module 160. The polymer film layer 120 is attached to a bottom surface of the window part 110 so that the first UV resin layer 130 to be described below may be attached to the polymer film layer 120. The UV resin layer 130 includes the second UV resin layer 140 to be described below, and is attached to a bottom surface of the polymer film layer 120 to transfer light. The second UV resin layer 140 receives light having passed through the first UV resin layer 130, and is attached to a bottom surface of the first UV resin layer 130 to prevent refractions and reflections of the transferred light. The touch sensor film module 160 and a bracket 151 formed in the display part 150 are attached to the second UV resin layer 140 together.

Further referring to FIG. 2, a pattern may be formed in the first UV resin layer. The pattern 131 may be one of a decoration pattern, a three-dimensional pattern formed with fine hair lines, and a molding pattern. Here, the pattern 131 may be a pattern other than the decoration pattern, the three-dimensional pattern, and the molding pattern (for example, a repeated pattern).

In addition, post-processes such as deposition 170 and printing 180 may be performed on the pattern. In an exemplary implementation, the post processes may be used to realize a color and a metallic feeling.

In exemplary embodiments, the thickness of the polymer film layer 120 may be between 0.05 mm and 0.15 mm. However, the thickness of the polymer film layer 120 may be less than 0.05 mm or more than 0.15 mm.

In exemplary embodiments, the material of the window part 110 may be one of tempered glass and reinforced plastic. However, the material of the window part 110 may be a material other than tempered glass and reinforced plastic.

In exemplary embodiments, the material of the polymer film layer 120 may be one of Polyethylene Terephthalate (PET), Poly Methyl Methacrylate (PMMA), and Poly Carbonate (PC). However, the material of the polymer film layer 120 may be a material other than the above-listed materials.

In exemplary embodiments, the display part 150 may be one of a Liquid Crystal Display (LCD), a Light Emitting Diode (LED), and an Active Matrix Organic Light Emitting Diode (AMOLED). However, the display part may be a display part other than the above-listed display parts.

Further referring to FIG. 3, in describing the second UV resin layer 140 in more detail, as illustrated in FIG. 3, the touch sensor film module 160 and the bracket 151 formed in the display part 150 may be attached to the second UV resin layer 140 together.

Here, the second UV resin layer 140 may be in a liquid state.

FIG. 4 is an enlarged view illustrating the touch panel having improved visibility according to an exemplary embodiment of the present invention.

Referring to FIG. 4, the polymer film layer 120 is attached to a bottom surface of the window part 110 by using an Optical Clean Adhesive (OCA) (not illustrated). The first UV resin layer 130 is formed on a bottom surface of the polymer film layer 120, and a pattern is formed in the first UV resin layer 130. The pattern 131 is a decoration pattern, and the decoration pattern is a repeated design pattern including fine hair lines. Post-processes such as deposition 170 and printing 180 are performed on the pattern 131 to realize a color and a metallic feeling. In this state, the second UV resin layer 140 in a liquid state is formed on a bottom surface of the first UV resin layer 130.

The touch sensor film module 160 and the bracket of the display part 150 are attached to the second UV resin together.

Further referring to FIG. 4, light is introduced into the window part 110, and the introduced light passes through the polymer film layer 120. Then, light is refracted and reflected whenever the light passes through the window part 110 and the polymer film layer 120.

The light having passed through the polymer film layer 120 is introduced into the first UV resin layer 130 and is refracted and reflected at the same time.

The light having passed through the first UV resin layer 130 passes the second UV resin layer 140 of the same kind, which prevents refractions and reflections.

That is, the light is refracted and reflected when passing through the first UV resin layer 130, and is introduced into the second UV resin layer 140 as it is. The introduced light passes through the second UV resin layer 140 as it is, and not being refracted and reflected. The second UV resin layer 140 passes the light without refracting and reflecting it, and the light is then transferred to the display part 150 after passing through the touch sensor film module 160.

Since the light having passed the first UV resin layer 130 passes the second UV resin layer 140 as it is and not being refracted and reflected, screen visibility can be improved, and screen degradation of the display part 150 due to a reduction in the transmittance of light can be addressed at the same time.

That is, by configuring the second UV resin layer 140 for additionally preventing refractions and reflections of light in the first UV resin layer 130, the visibility of a product can be enhanced, the clarity of the product can be enhanced, and the design of the product can become more appealing.

Figure 1:
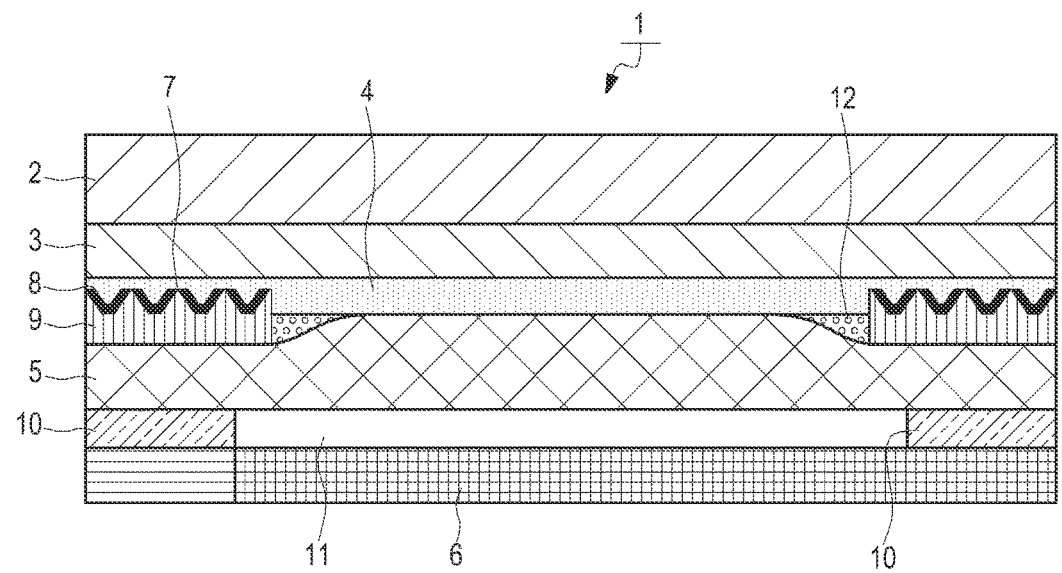
FIG. 1 is a view illustrating a configuration of a touch panel including a window according to the related art.

According to the related art, when a film-type touch sensor film module is attached to a bottom surface of a UV resin layer having a pattern, an attached space is formed between the pattern and the touch sensor film module, and bubbles 12 (see FIG. 1) are generated in the space. Accordingly, a defect rate of the product increases.

Thus, in order to address these disadvantages, by applying the second UV resin layer 140 in a liquid state to the first UV hardening resin layer 130 having a pattern 130, a space formed by a pattern according to the related art can be prevented and bubbles 12 (see FIG. 1) generated in the space are prevented. Thus, the defect rate of the product due to the bubbles generated can be reduced.

In addition, although the bracket of the display part 150 and the touch sensor film module 160 are attached to each other by using a double-sided tape 10 (see FIG. 1) to form an air layer in the related art, the attached area of the double-sided tape is so small that the display part 150 and the touch sensor film module 160 can be easily separated from each other.

Thus, in order to address the disadvantages, in the second UV resin layer 140, the attached area may be made wider so that the touch sensor film module 160 and the display part 150 can be attached to each other so as to enhance an attaching force of the product.

Touch panel 10 (see FIG. 2), according to an exemplary embodiment of the present invention, is applicable to an electronic device (not illustrated). However, the present invention is not necessarily limited to electronic devices and may be applied to various types of electronic devices.

Examples of various types of electronic devices according to exemplary embodiments of the present invention may include all information communication devices and multimedia devices such as an MP3 player, a Portable Multimedia Player (PMP), a navigation system, a gaming device, a laptop computer, an advertising panel, a television (TV), a digital broadcasting player, a Personal Digital Assistant (PDA), and a smart phone, and application devices thereof, including all mobile communication terminals operated based on communication protocols corresponding to various communication systems.

Hereinafter, a method of manufacturing the touch panel having improved visibility according to an exemplary embodiment of the present invention will be described in detail.

Figure 5:
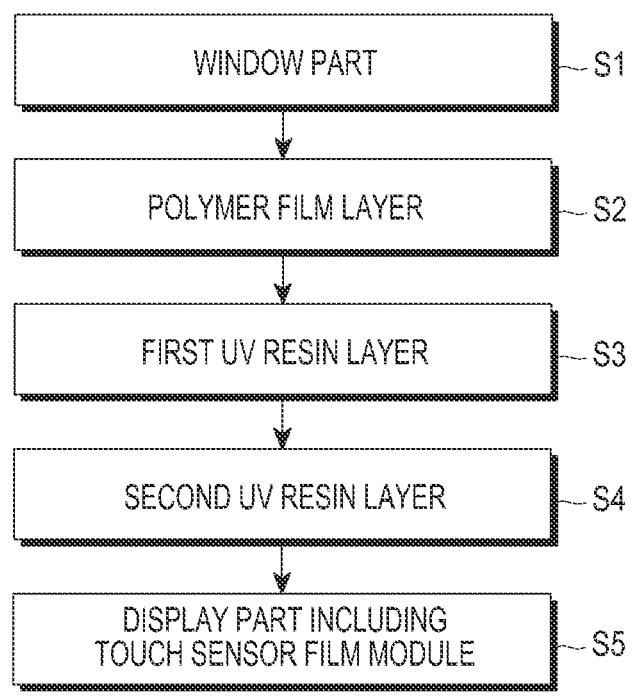
FIG. 5 is a flowchart illustrating a method of manufacturing a touch panel having improved visibility according to the first exemplary embodiment of the present invention.

FIG. 5 is a view illustrating a method of manufacturing the touch panel having improved visibility according to an exemplary embodiment of the present invention.

Referring to FIG. 5, a method of manufacturing the touch panel 100 having improved visibility will be described. In step S1, the window part 110 formed of tempered glass is manufactured.

In step S2, the polymer film layer 120 is attached to a bottom surface of the window part 110 manufactured in step S1 by using an Optical Clean Adhesive (OCA) (not illustrated).

In step S3, the first UV resin layer 130 is attached to a bottom surface of the polymer film layer 120 from step S2.

The decoration pattern 131 is formed in the first UV resin layer 130, and the decoration pattern 131 is processed through deposition 170 and printing 180.

In step S4, the second UV resin layer 140 for preventing refractions and reflections of light is attached to a bottom surface of the first UV resin layer 130 from step S3.

In step S5, the display part 150 including the touch sensor film module 160 is attached to a bottom surface of the second UV resin layer 140 from step S4.

The first UV resin layer 130 corresponds to a pattern UV resin layer for forming a pattern, and the second UV resin layer 140 corresponds to an attaching UV resin layer for attaching the touch sensor film module 160 and the display part 150 together.

Second Exemplary Embodiment

Figure 6:
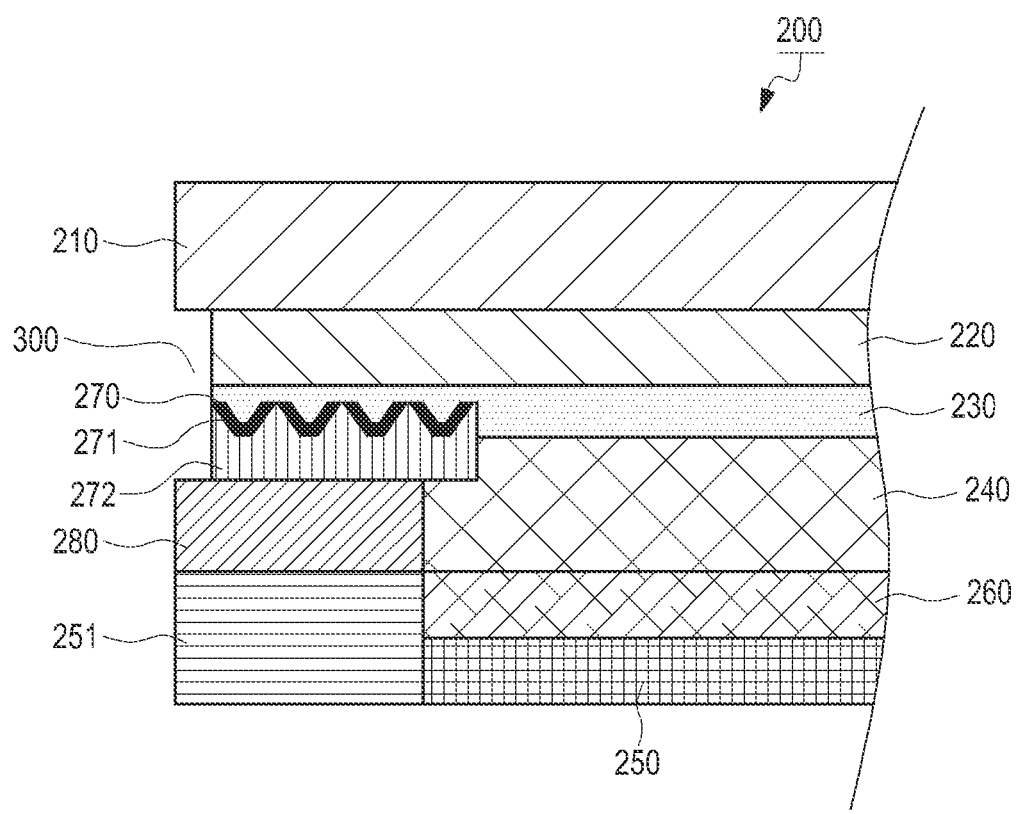
FIG. 6 is a view illustrating a coupled state of a touch panel having improved visibility according to a second exemplary embodiment of the present invention.
Figure 7:
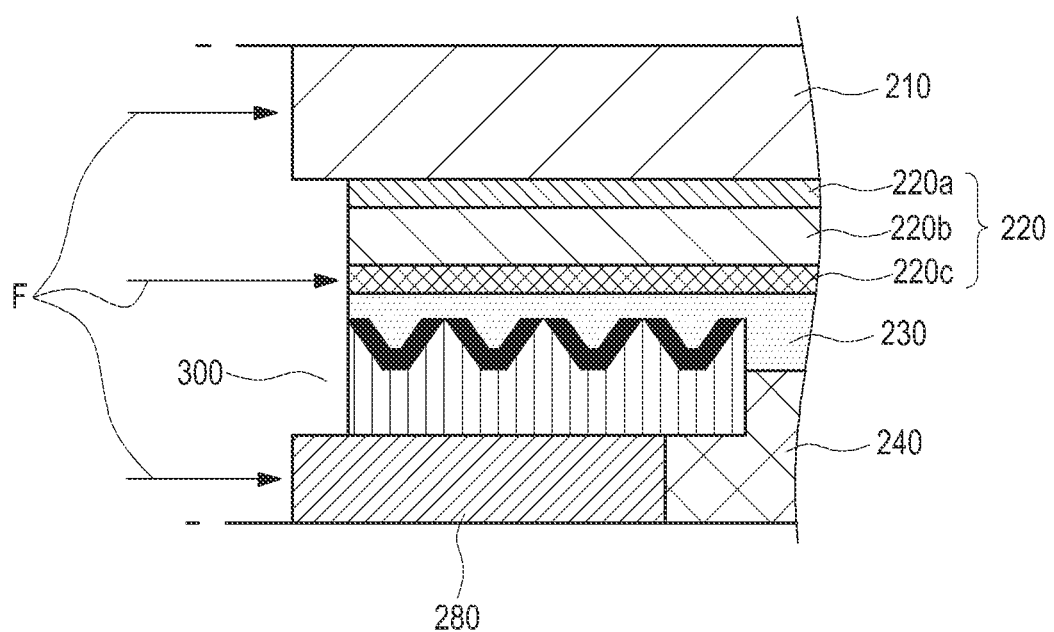
FIG. 7 is an enlarged view illustrating a polymer film layer of the touch panel having improved visibility according to the second exemplary embodiment of the present invention.

FIG. 6 is a view illustrating a coupled state of a touch panel having improved visibility according to a second exemplary embodiment of the present invention. FIG. 7 is an enlarged view illustrating a polymer film layer of the touch panel having improved visibility according to the second exemplary embodiment of the present invention.

Referring to FIGS. 6 and 7, the touch panel 200 includes a window part 210 including a polymer film layer 220, a display part 250 including first and second UV resin layers 230 and 240 and a touch sensor film module 260. The polymer film layer 220 is attached to a bottom surface of the window part 210 so that the first UV resin layer 230 to be described below may be attached to the polymer film layer 220. The first UV resin layer 230 includes the second UV resin layer 240 to be described below, and is attached to a bottom surface of the polymer film layer 220 to transfer light. The second UV resin layer 240 receives light having passed through the first UV resin layer 230, and is attached to a bottom surface of the first UV resin layer 230 to prevent refractions and reflections of the transferred light. The touch sensor film module 260 is attached to a bottom of the second UV resin layer 240.

In the touch panel 200, by additionally configuring the second UV resin layer 240, refractions and reflections of light caused by use of the first UV resin layer 230, and lowering of the screen quality of the display part 250 due to distortion of a surface of the first UV resin layer 230 and scratches, can be prevented.

A pattern 270 may be formed in the first UV resin layer 230. A bracket 251 formed in the display part 250 is attached to a bottom surface of the pattern 270 by using a double-sided tape 280.

The pattern 270 may be any one of a decoration pattern, a three-dimensional pattern formed with hair lines, a molding pattern, or a lattice pattern. The pattern 270 may also be a pattern other than the disclosed patterns (for example, a repeated pattern).

In addition, post-processes such as deposition 271 and printing 272 may be performed on the pattern 270. In an exemplary implementation, the post processes may be used to realize a color and a metallic feeling, wherein the pattern 270 may be realized on a bottom surface of the polymer film layer 220 through a roller or stamp process.

In describing the polymer film layer 220 with reference to FIG. 7 in more detail, the polymer film layer 220 may include a bonding layer 220a, a film body layer 220b, and a soft primer layer 220c. The bonding layer 220a is formed of an OCA, and the polymer 220 is attached to a bottom surface of the window part 210 by using the optical clear adhesive. The film body layer 220b is formed on a bottom surface of the bonding layer 220a. The soft primer layer 220c is formed on a bottom surface of the film body layer 220b to increase a bonding force with the first UV resin layer 230 and an impact-resistant property.

In exemplary embodiments, a thickness of the bonding layer 220a may be 25 μm to 50 μm. However, a thickness of the bonding layer 220a may be less than 25 μm or more than 50 μm.

A material of the film body layer 220b may be any one of PET, PMMA, and PC. However, the material of the polymer film layer 220 may also be a material other than the above-listed materials.

The primer layer 220c may correspond to a single-layered or multilayered primer layer to increase a bonding force with the first UV resin layer 230 and to add an impact-resistant property.

A hardness of the primer layer 220c may be a pencil hardness of H to B to prevent the first UV resin layer 230 from cracking when an electronic device is dropped.

The polymer film layer 220 may be bonded to the window part 210 through a roller or stamp process.

An upper surface of the window part 210 may correspond to a plane or a shape having a curvature. That is, an upper surface of the window part 210 may be any one of 2.5 D and 3D shapes having a curvature.

The first and second UV resin layers 230 and 240 may be formed of an acrylate or polyurethane material. However, the first and second UV resin layers 230 and 240 may also be a material other than the disclosed materials. A hardness of the first and second resin layers 230 and 240 may be a pencil hardness of F to B.

As illustrated in FIG. 6, the polymer film layer 220 and the first UV resin layer 230 may be formed to be smaller than the window part 210 and the bracket 251 formed in the display part 250.

That is, an avoidance space 300 for avoiding an impact F (see FIG. 7) transferred to a side of the electronic device if, for example, the electronic device (not illustrated) is dropped, or for preventing an external coupling structure from being impacted when the coupling structure is pushed in, is formed between the polymer film layer 220 and the bracket 251.

In exemplary embodiments, a thickness of the avoidance space 300 may be from 0 to 0.3 mm, or more specifically, a thickness of the avoidance space 300 may be from only 0 mm to 0.25 mm.

In describing a process of manufacturing the touch panel 200 having improved visibility in more detail with reference to FIGS. 6 and 7, as illustrated in FIG. 6, the window part 210 is attached to the bonding layer 220a formed of an OCA (not illustrated) formed on an upper surface of the polymer film layer 220. The first UV resin layer 230 is attached by using the soft primer layer 220c formed on a bottom surface of the polymer film layer 220. The pattern 270 is formed in the first UV resin layer 230. The pattern may correspond to any of a pattern of a hair line, a lattice pattern, and the like. In this state, the second UV resin layer 240 is attached to a bottom surface of the first UV resin layer 230. The touch sensor film module 260 is attached to the second UV resin layer 240, and the bracket 251 of the display part 250 is attached to the pattern 270 by using a double-sided tape 280.

Referring to FIG. 7, the polymer film layer 220 and the first UV resin layer 230 are formed to be smaller than the window part 210 and the bracket 251 of the display part 250, and thus the polymer film layer 220 and the first UV resin layer 230 are formed between the window part 210 and the bracket 251 of the display part 250 are recessed by a predetermined depth to inner sides of the window part 210 and the bracket 251 of the display part 250 at the same time.

That is, the polymer film layer 220 and the first UV resin layer 230 are recessed and the avoidance space 300 is formed between the window part 210 and the bracket 251, and an impact F (see FIG. 7) transferred to side surfaces of the polymer film layer 200 and the first UV resin layer 230 can be avoided by the avoidance space 300 when the touch panel 200 drops.

Referring to FIG. 7, when the touch panel 200 is dropped, the protruding window part 210 and bracket 251 are brought into contact so that an impact F is applied to the protruding window part 210 and bracket 251 and the mitigated impact F is transferred to the polymer film layer 220 and the first UV resin layer 230.

Further, if, for example, an external coupling structure (not illustrated) is pushed into the touch panel 200, the window part 210 and the bracket 251 first contact the external coupling structure so that an impact is applied to the window part 210 and the bracket 251 and the mitigated impact is transferred to the polymer film layer 220 and the first UV resin layer 230.

Thus, the polymer film layer 220 and the first UV resin layer 230 are first directly brought into contact when the touch panel 200 is dropped, and an external coupling structure is pushed in to prevent an impact F (see FIG. 7) from being transferred. Accordingly, the polymer film layer 220 and the first UV resin layer 230 can be protected.

Additionally, the primer layer (not illustrated) formed on an existing polymer film layer 3 (see FIG. 1) may be formed of a hard material, causing the UV resin layer 4 (see FIG. 1) to easily crack when an electronic device is dropped.

Thus, in order to address this disadvantage, in exemplary embodiments of the present invention, a soft primer layer may be formed in the polymer film layer 220 to improve a bonding force of the first UV resin layer 230 and to prevent the first UV resin layer 230 from cracking due to an impact F (see FIG. 7) generated if, for example, an electronic device is dropped.

Hereinafter, a method of manufacturing the touch panel having improved visibility according to the second embodiment of the present invention will be described in detail.

Figure 8:
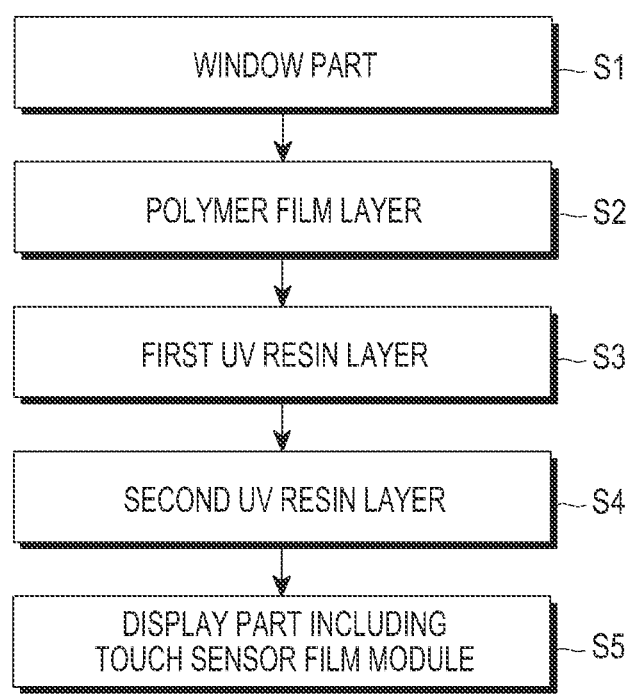
FIG. 8 is a flowchart illustrating a method of manufacturing a touch panel having improved visibility according to the second exemplary embodiment of the present invention.

FIG. 8 is a view illustrating the method of manufacturing a touch panel having improved visibility according to an exemplary embodiment of the present invention.

Referring to FIG. 8, the method of manufacturing the touch panel 200 having improved visibility will be described. In step S1, the window part 210 formed of tempered glass is manufactured.

In step S2, the polymer film layer 220 is attached to a bottom surface of the window part 210 manufactured in step S1 by using the bonding layer 220a.

In step S3, the first UV resin layer 230 is attached to a bottom surface of the polymer film layer 220 by using the soft primer layer 220c from step S2.

A pattern 270 such as a hair line, a lattice pattern, or the like may be formed in the first UV resin layer 230

In step S4, the second UV resin layer 240 for preventing refractions and reflections of light is attached to a bottom surface of the first UV resin layer 230 from step S3.

In step S5, the display part 250 including the touch sensor film module 260 is attached to a bottom surface of the second UV resin layer 240 from step S4.

The polymer film layer 220 and the first UV resin layer 230 are formed to be smaller than the window part 210 and the bracket 251 formed in the display part 250.

That is, an avoidance space 300 for avoiding an impact transferred to a side of the electronic device if, for example, the electronic device (not illustrated) is dropped, or for preventing an external coupling structure from being impacted when the coupling structure (not illustrated) is pushed in, is formed between the polymer film layer 220 and the bracket 251.

In exemplary embodiments of the present invention, a thickness of the avoidance space 300 may be from 0 to 0.3 mm, or more specifically, a thickness of the avoidance space 300 may be from only 0 to 0.25 mm.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of arranging a touch panel having improved visibility, the method comprising:
    manufacturing a window part;
    attaching a polymer film layer to a bottom surface of the window part;
    attaching a first ultraviolet (UV) resin layer to a bottom surface of the polymer film layer;
    forming a pattern in the first UV resin layer;
    attaching a second UV resin layer for preventing refractions and reflections of light to a bottom surface of the first UV resin layer, the second UV resin layer comprising a UV resin in a liquid state;
    attaching a display part to a bottom surface of a touch sensor film module;
    attaching a first bracket at a first side end of the display part and the touch sensor film;
    attaching a second bracket at a second side end of the display part and the touch sensor film; and
    attaching the touch sensor film module, the first bracket, and the second bracket, to a bottom surface of the second UV resin layer,
    wherein the first UV resin layer is attached through a soft primer layer formed in the polymer film layer, and
    wherein the soft primer layer corresponds to a single-layered or multilayered primer layer.

2. The method of claim 1, wherein the second UV resin layer corresponds to an attaching UV resin layer.

3. The method of claim 1, wherein the polymer film layer is attached to the bottom surface of the window part by a bonding layer formed of an Optical Clear Adhesive (OCA).

4. The method of claim 3, wherein a thickness of the bonding layer is from 25 μm to 50 μm.

5. The method of claim 1, wherein a material of the polymer film layer comprises at least one of Polyethylene Terephthalate (PET), Poly Methyl Methacrylate (PMMA), and Poly Carbonate (PC).

6. The method of claim 1, wherein a hardness of the soft primer layer is a pencil hardness of from H to B.

7. The method of claim 1, wherein the pattern comprises one of a decoration pattern, a three-dimensional pattern, or a molding pattern.

8. The method of claim 1, further comprising performing a post process comprising at least one of deposition or printing.

9. The method of claim 8, wherein the post process provides at least one of a color and a metallic feeling in the first UV resin layer.

10. The method of claim 1, wherein the second UV resin layer is disposed in a liquid state.

11. The method of claim 1, wherein a top surface of the first bracket is attached to the first UV resin layer by a double-sided tape.

12. The method of claim 1, wherein the first UV resin layer is smaller in length than the window part.

13. The method of claim 12, wherein the first UV resin layer is smaller in length than the window part by 0 to 0.3 mm on each side.

14. A touch panel having improved visibility, the touch panel comprising:
a window part;
a polymer film layer attached to a bottom surface of the window part;
a first ultraviolet (UV) resin layer attached to a bottom surface of the polymer film layer, the first UV having a pattern;
a second UV resin layer attached to a bottom surface of the first UV resin layer, the second UV resin layer formed in a liquid state and configured to prevent refractions and reflections of light; and
a touch sensor film module;
a display part attached to a bottom surface of the touch sensor film module;
a first bracket attached at a first side end of the display part and the touch sensor film; and
a second bracket attached at a second side end of the display part and the touch sensor film,
wherein the touch sensor film module, the first bracket, and the second bracket, are attached to a bottom surface of the second UV resin layer,
wherein the first UV resin layer is attached through a soft primer layer formed in the polymer film layer, and wherein the soft primer layer corresponds to a single-layered or multilayered primer layer.

15. The touch panel of claim 14, wherein the second UV resin layer corresponds to an attaching UV resin layer.

16. The touch panel of claim 14, wherein the polymer film layer is attached to the bottom surface of the window part by a bonding layer formed of an Optical Clear Adhesive (OCA).

17. The touch panel of claim 16, wherein a thickness of the bonding layer is from 25 μm to 50 μm.

18. The touch panel of claim 14, wherein a material of the polymer film layer comprises at least one of Polyethylene Terephthalate (PET), Poly Methyl Methacrylate (PMMA) and Poly Carbonate (PC).

19. The touch panel of claim 14, wherein a hardness of the soft primer layer is a pencil hardness of from H to B.

20. The touch panel of claim 14, wherein the pattern comprises one of a decoration pattern, a three-dimensional pattern, or a molding pattern.

21. The touch panel of claim 14, further comprising performing a post process comprising at least one of deposition or printing.

22. The touch panel of claim 21, wherein the post process provides at least one of a color and a metallic feeling in the first UV resin layer.

23. The touch panel of claim 14, wherein the second UV resin layer is in a liquid state.

24. The touch panel of claim 14, wherein a material of the window part is one of tempered glass and reinforced plastic.

25. The touch panel of claim 14, wherein the display part comprises one of a Liquid Crystal Display (LCD), a Light Emitting Diode (LED), or an Active Matrix Organic Light Emitting Diode (AMOLED).

26. The touch panel of claim 14, wherein a top surface of the first bracket is attached to the first UV resin layer by a double-sided tape.

27. The touch panel of claim 14, wherein the first UV resin layer is smaller in length than the window part.

28. The touch panel of claim 27, wherein the first UV resin layer is smaller in length than the window part by 0 to 0.3 mm on each side.

* * * * *